(12) United States Patent
Shin et al.

(10) Patent No.: US 9,757,923 B2
(45) Date of Patent: Sep. 12, 2017

(54) DISPLAY DEVICE AND METHOD OF MANUFACTURING THE SAME

(71) Applicant: Samsung Display Co., Ltd., Yongin (KR)

(72) Inventors: Dong Myung Shin, Cheonan-si (KR); Seong Geun Won, Cheonan-si (KR); Young Ji Kim, Hwaseong-si (KR); Hyo Young Mun, Daegu (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/660,097

(22) Filed: Mar. 17, 2015

(65) Prior Publication Data

US 2016/0136927 A1    May 19, 2016

(30) Foreign Application Priority Data

Nov. 14, 2014   (KR) .......................... 10-2014-0158652

(51) Int. Cl.
*B32B 7/12*    (2006.01)
*B32B 27/36*   (2006.01)
(Continued)

(52) U.S. Cl.
CPC ................. *B32B 7/12* (2013.01); *B32B 3/04* (2013.01); *B32B 5/20* (2013.01); *B32B 7/045* (2013.01); *B32B 9/007* (2013.01); *B32B 9/04* (2013.01); *B32B 9/046* (2013.01); *B32B 15/04* (2013.01); *B32B 15/046* (2013.01); *B32B 15/20* (2013.01); *B32B 27/06* (2013.01); *B32B 27/065* (2013.01); *B32B 27/08* (2013.01); *B32B 27/286* (2013.01); *B32B 27/32* (2013.01); *B32B 27/34* (2013.01); *B32B 27/36* (2013.01); *B32B 37/12* (2013.01);
(Continued)

(58) Field of Classification Search
CPC B32B 7/12; B32B 27/06; B32B 27/36; B32B 27/286; B32B 27/32; B32B 27/285; B32B 15/08; G09G 3/06
See application file for complete search history.

(56) References Cited

U.S. PATENT DOCUMENTS 5,805,245 A * 9/1998 Davis ...................... G02F 1/132
349/185
2002/0011660 A1* 1/2002 Ebihara ................... H01J 17/28
257/712

(Continued)

FOREIGN PATENT DOCUMENTS

JP   2010-089441     4/2010
KR   10-2001-0078953  8/2001
(Continued)

*Primary Examiner* — Hai Vo
(74) *Attorney, Agent, or Firm* — H.C. Park & Associates, PLC

(57) ABSTRACT

A display device may include a display panel, a first adhesive layer attached on one surface of the display panel, a polymer layer attached on the display panel via the first adhesive layer, a second adhesive layer attached on a surface other than a surface of the first adhesive layer which has been attached on the one surface of the display panel, and a heat sink layer attached on the polymer layer via the second adhesive layer, wherein the at least one of the first adhesive layer, the polymer layer, and the second adhesive layer includes a color changing ink.

10 Claims, 23 Drawing Sheets

(51) Int. Cl.

| | | |
|---|---|---|
| *B32B 37/14* | (2006.01) | |
| *B32B 27/32* | (2006.01) | |
| *B32B 15/08* | (2006.01) | |
| *B32B 15/20* | (2006.01) | |
| *B32B 27/06* | (2006.01) | |
| *B32B 27/28* | (2006.01) | |
| *B32B 37/12* | (2006.01) | |
| *B32B 5/20* | (2006.01) | |
| *B32B 7/04* | (2006.01) | |
| *B32B 9/00* | (2006.01) | |
| *B32B 9/04* | (2006.01) | |
| *B32B 15/04* | (2006.01) | |
| *B32B 27/08* | (2006.01) | |
| *B32B 27/34* | (2006.01) | |
| *B32B 3/04* | (2006.01) | |
| *B32B 37/18* | (2006.01) | |

(52) U.S. Cl.
CPC ........... *B32B 27/285* (2013.01); *B32B 37/182* (2013.01); *B32B 2266/0214* (2013.01); *B32B 2266/0242* (2013.01); *B32B 2266/0278* (2013.01); *B32B 2266/06* (2013.01); *B32B 2266/08* (2013.01); *B32B 2305/022* (2013.01); *B32B 2307/302* (2013.01); *B32B 2307/304* (2013.01); *B32B 2307/306* (2013.01); *B32B 2307/40* (2013.01); *B32B 2307/402* (2013.01); *B32B 2307/4023* (2013.01); *B32B 2307/546* (2013.01); *B32B 2307/56* (2013.01); *B32B 2307/71* (2013.01); *B32B 2457/20* (2013.01); *B32B 2457/206* (2013.01)

(56) References Cited

U.S. PATENT DOCUMENTS

| | | | |
|---|---|---|---|
| 2005/0174024 A1* | 8/2005 | Hori | H01J 11/34 313/112 |
| 2006/0262057 A1* | 11/2006 | Sumiyoshi | G02F 1/1323 345/87 |
| 2008/0125524 A1* | 5/2008 | Ishida | G02B 5/223 524/104 |
| 2009/0087639 A1* | 4/2009 | Li | H05K 7/20963 428/304.4 |
| 2009/0295297 A1* | 12/2009 | Hwang | G02B 5/208 315/169.4 |
| 2012/0187367 A1* | 7/2012 | Modi | C09K 11/02 257/13 |
| 2016/0161770 A1* | 6/2016 | Joo | G02F 1/0102 359/241 |

FOREIGN PATENT DOCUMENTS

| | | |
|---|---|---|
| KR | 10-2008-0093346 | 10/2008 |
| KR | 10-1208713 | 11/2012 |

\* cited by examiner

DISPLAY DEVICE AND METHOD OF MANUFACTURING THE SAME

CROSS REFERENCE TO RELATED APPLICATION

This application claims priority from and the benefit of Korean Patent Application No. 10-2014-0158652, filed on Nov. 14, 2014, which is hereby incorporated by reference for all purposes as if fully set forth herein.

BACKGROUND

Field

Exemplary embodiments of the present invention relate to a display device and a method of manufacturing the display device. More particularly, exemplary embodiments of the present invention relate to a thin display device, and a method of manufacturing the display device with reduced costs.

Discussion of the Background

A cathode ray tube (CRT) display was a primarily used display device in the past. Recently, however, flat panel display devices such as a plasma display panel (PDP), a liquid crystal display device (LCD), and an organic light emitting diode (OLED), have been widely used in place of the CRT display.

As opposed to other non-self emission types of display devices, an organic light emitting diode (OLED) is a self-emission type of display and, thus, may not employ a backlight. Therefore, the OLED display may be lighter and thinner than other types of display devices.

Further, in comparison with the LCD, the OLED display has a better viewing angle and contrast ratio, uses less power, allows operation of direct lower voltage, has a faster response speed, and utilizes solid state elements therein. Thus, an OLED display may be resistant to external impact and may be operated in a wide temperature range.

OLED displays are currently applied to personal portable electronic devices such as mobile phones and personal digital assistants (PDAs), as well as TVs and monitors. Therefore, these types of electronic devices can be made significantly lighter and smaller.

However, despite efforts for manufacturing a light and thin OLED, there are many components used in an OLED. Thus, an optimally thin and light OLED may be difficult to produce due to the number of components used.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display device capable of minimizing the thickness of a display device, and a method of manufacturing the display device.

Additional aspects will be set forth in the detailed description which follows, and, in part, will be apparent from the disclosure, or may be learned by practice of the inventive concept.

An exemplary embodiment of the present invention discloses a display panel, a first adhesive layer attached on one surface of the display panel, a polymer layer attached on the display panel via the first adhesive layer, a second adhesive layer attached on a surface other than a surface of the first adhesive layer which has been attached on the one surface of the display panel, and a heat sink layer attached on the polymer layer via the second adhesive layer. At least one of the first adhesive layer, the polymer layer, and the second adhesive layer includes a color changing ink.

An exemplary embodiment of the present invention also discloses a method of manufacturing a display device, including forming a stacked panel by sequentially stacking a first adhesive layer, a polymer, and a second adhesive layer including a color changing ink in at least one layer at one surface of a display panel, changing the color changing ink to become transparent, and fitting an align mark.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
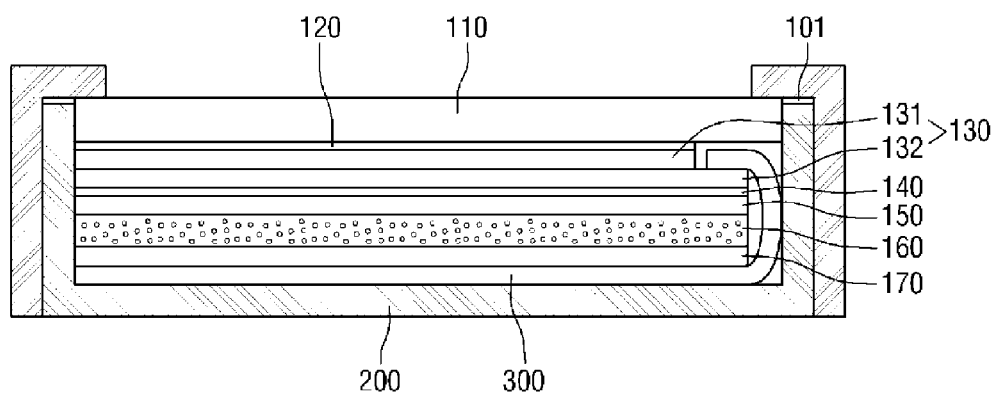
FIG. 1 is a cross-sectional view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the present invention will be described with reference to the attached drawings.

Figure 2:
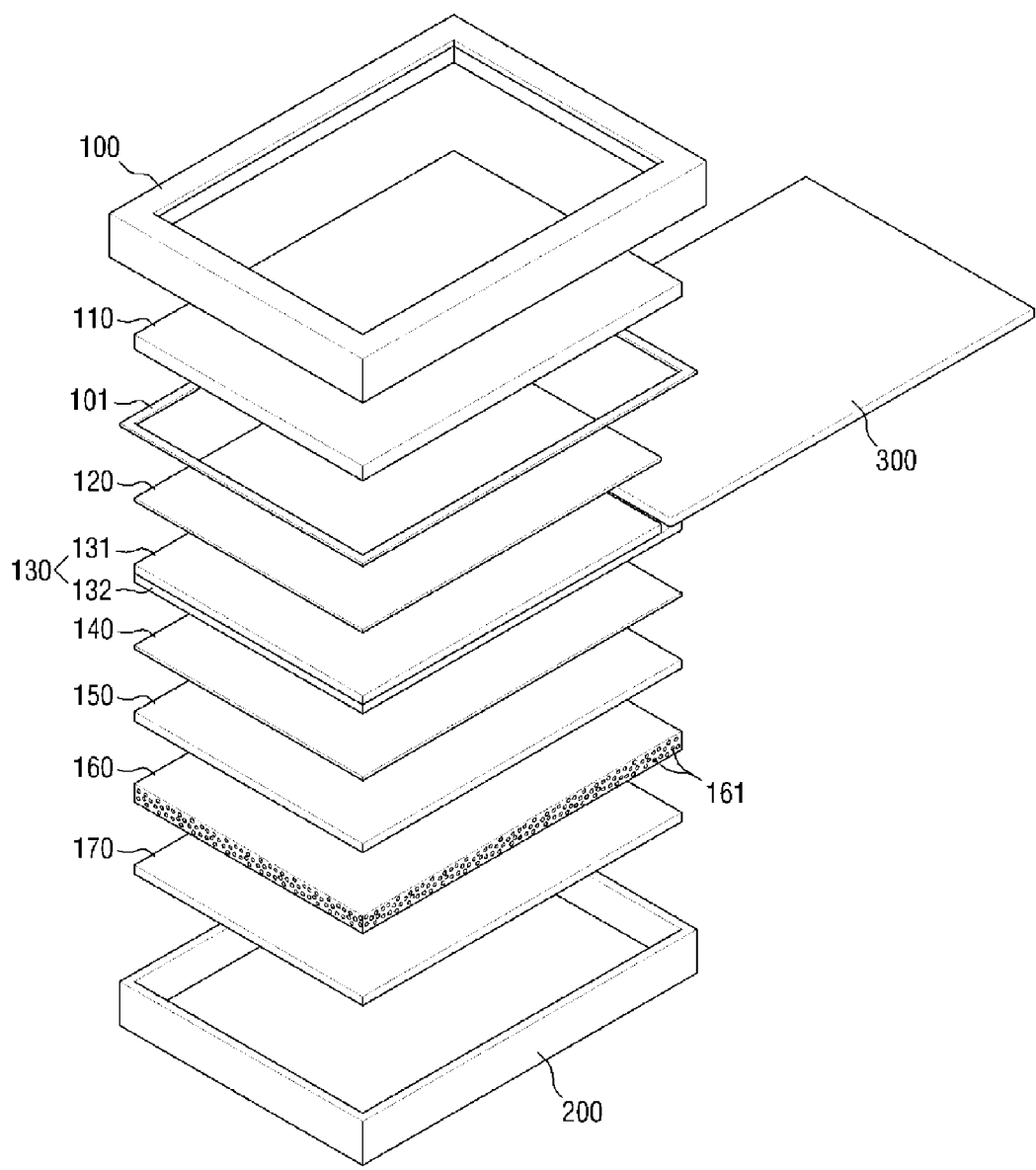
FIG. 2 is an exploded perspective view of a display device according to an exemplary embodiment of the present invention.

FIG. 1 is a cross-sectional view of a display device according to an exemplary embodiment of the present invention, and FIG. 2 is an exploded perspective view of a display device according to an exemplary embodiment of the present invention.

As illustrated in FIGS. 1 and 2, a display device according to an exemplary embodiment of the present invention includes an upper cover 100, a cover window 110, an adhesive tape 101, a polarizing film 120, a display panel 130, a first adhesive layer 140, a polymer layer 150, a second adhesive layer 160, a heat sink layer 170, a lower cover 200, and a printed circuit board 300.

The upper cover 100 covers the upper part of the lower cover 200, and the cover window 110 is made of transparent materials so as to transmit light through a display area 2 of the upper end part of the upper cover 100 (described in further detail below).

An adhesive tape 101 is disposed along the side part of the cover window 110, and the upper end surface of the lower cover 200 is attached to the inner surface of the upper cover 100 by the adhesive tape 101. Adhesive tape 101 may have a predetermined width.

Additional device films may be further attached on the upper surface of the display panel 130. For example, a polarizing film 120 may be attached to prevent the reflection of ambient external light from disturbing an image expressed by a display panel 130, but other films may be used depending on device needs.

The display panel 130 may be a panel for displaying an image and may include a pixel area arranged in a matrix. At this time, the display panel 130 may include upper and lower substrates 131 and 132 facing each other. Various forms of panels may be used as the display panel 130. For example, a bottom emission type organic light emitting panel, in which light is emitted in the direction of an array substrate where a thin film transistor has been formed, or a top emission type organic light emitting panel, in which light is emitted in the direction of a substrate facing an array substrate, may be used. As a further example, an organic light emitting panel where a thin film transistor and an organic light emitting diode are formed on the same array substrate, or an organic light emitting panel where a thin film transistor and an organic light emitting diode are formed on different substrates, may be used.

One side of the first adhesive layer 140 may be attached to the polymer layer 150, and the other side may be temporarily attached on an embossing sheet (not shown). That is, if the emboss sheet is pressed on the first adhesive layer 140, the contacted surface of the first adhesive layer 140 is embossed by the embossing sheet. PET materials may be applied using the emboss sheet. The first adhesive layer 140 may be formed of an acrylic compound and, as such, may be a highly tacky adhesive for attaching the polymer layer 150 to the display panel 130. The thickness of the first adhesive layer 140 may be between 0.1 µm and 8 µm. If the thickness of the first adhesive layer 140 is 0.1 µm or more, sufficient adhesive force is provided to secure the display panel 130 to the polymer layer 150, and if the thickness of the first adhesive layer 140 is 8 µm or less, the overall thickness of the display device may be minimized.

Embossings, which are not shown, may be formed on the embossing sheet in a mutually parallel manner. Here, the surface where the embossings are formed may be a surface which is attached to the first adhesive layer 140 of the embossing sheet. Various methods may be used as a method of forming embossings on the embossing sheet. For example, when coating and curing an adhesive mixture for forming an embossing, coating using an embossing roll and a transferring a film where the embossing has been formed may be employed.

The polymer layer 150 may have a thickness between 1 µm and 12 µm in order to protect the lower substrate of the display panel 130 and minimize thickness of the display panel 130. Here, when the thickness of the polymer layer 150 is 1 µm or more, the lower substrate of the display panel 130 may be sufficiently protected, and when the thickness of the polymer layer 150 is 12 µm or less, the thickness of the display panel may be minimized. Materials having good heat resistance and good electrical attributes may be used as materials of the polymer layer 150. For example, polyethylene terephthalate (PET), polyethylene naphthalate (PEN), poly ethersulfone (PES), polyethylene (PE), etc. may be used, but the embodiment is not limited thereto. Any material having such attributes may be used.

The second adhesive layer 160 may be formed of at least one of a urethane compound, a silicon compound, and an acrylic compound, but is not limited thereto.

Further, a plurality of cells 161 are formed in the inside of the second adhesive layer 160, and the second adhesive layer 160 may absorb external forces by having a cushion (foam structure) created by the cells 161. In the present embodiment, a cell 161 may include an open cell, a closed cell, and a combination thereof. That is, a path may be formed between cells 161, and thus the cells 161 may be formed of opened cells, closed cells, or a combination thereof. The thickness of the second adhesive layer 160 may be between 10 µm and 80 µm. Here, if the thickness of the second adhesive layer 160 is 10 µm or more, sufficient adhesive force is provided to secure the polymer layer 150, and if the thickness of the second adhesive layer 160 is between 10 µm and 80 µm, second adhesive layer 160 may provide sufficient buffering force for absorbing an external impact. If the thickness of the second adhesive layer 160 is 80 µm or less, the overall thickness of the display device may be minimized.

Hence, in a flexible display device according to an exemplary embodiment of the present invention, materials having relatively low impact-resistance and having flexibility such as a polyamide (PI) and a polyethylene terephthalate (PET) may be used as the substrate of the display panel 130.

Further, the cells 161 may be formed by air bubble dispersion, that is, by injecting air from outside the cells, or by using a cell forming agent at the inside of the second adhesive layer 160. At this time, a thermal foaming agent (chemical foaming agent), etc. may be used as the cell forming agent.

The heat sink layer 170 may be formed of a material having good thermal conductivity, and particularly having high thermal conductivity in a plane direction, such as graphite, but the embodiment is not limited thereto. For example, materials having high thermal conductivity of about 100 W/mK or more may be used, such as, aluminum (Al) or copper (Cu), but the embodiment is not limited thereto.

The heat sink layer 170 may include a plurality of layers formed of different materials. For example, a dual layer structure including a graphite layer and a copper layer, a dual layer structure including a graphite layer and an aluminum layer, etc. may be used, but the embodiment is not limited thereto.

The heat sink layer 170 may inhibit local temperature rise of the display panel 130 by dispersing heat emitted from a semiconductor device (not shown) in the display panel 130.

An electronic device (not shown) for processing a driving signal may be mounted on a flexible circuit board 300. The flexible circuit board 300 may include a connector (not shown) for transmitting an external signal to the display panel 130. The flexible circuit board 300 may be made of flexible materials, may refract light/heat in the direction of the heat sink layer 170, and be attached to the lower surface of the heat sink layer 170.

Though not illustrated in FIGS. 1 and 2, in an exemplary embodiment of the present invention, a flexible circuit board may be formed only in a refraction area of the display panel. In this case, a printed circuit board may be formed on a portion of the display panel that is attached on the lower side of the heat sink layer 170, and the flexible circuit board may electrically connect the printed circuit board with a pad area (not shown) of the display panel 130.

Figure 3:
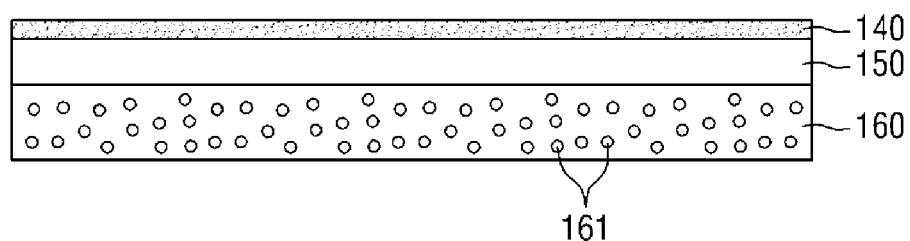
FIG. 3 is a cross-sectional view of a color changing ink which is formed on a first adhesive layer of a display device according to an exemplary embodiment of the present invention.
Figure 4:
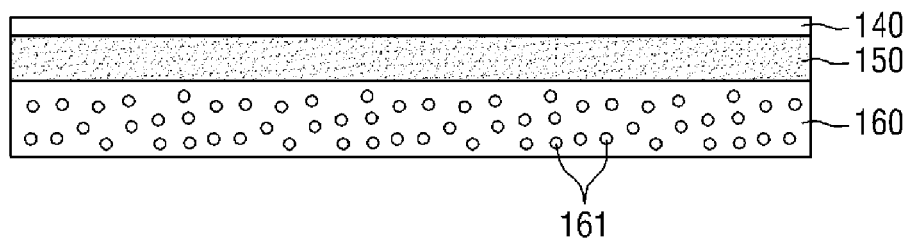
FIG. 4 is a cross-sectional view of a color changing ink which is formed on a polymer layer of a display device according to an exemplary embodiment of the present invention.
Figure 5:
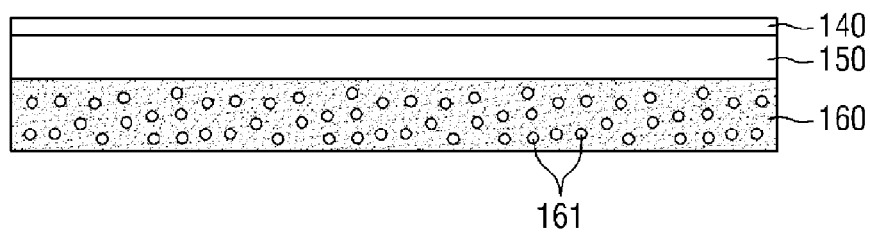
FIG. 5 is a cross-sectional view of a color changing ink which is formed on a second adhesive layer of a display device according to an exemplary embodiment of the present invention.

FIG. 3 is a cross-sectional view of a color changing ink formed on a first adhesive layer of a display device according to an exemplary embodiment of the present invention, FIG. 4 is a cross-sectional view of a color changing ink formed on a polymer layer of a display device according to an exemplary embodiment of the present invention, and FIG. 5 is a cross-sectional view of a color changing ink formed on a second adhesive layer of a display device according to an exemplary embodiment of the present invention. As illustrated in FIGS. 3 to 5, a color changing ink may be applied to one of a first adhesive layer 140, a polymer layer 150, or a second adhesive layer 160. Zion ink, which is a thermochromics ink made by mixing materials of which the color is a changed at certain temperatures, may be used as the color changing ink, but exemplary embodiments of the present invention are not limited thereto. For example, a photochromic ink in which the color is changed when light is radiated on it may be used.

First, a case where Zion ink is used as the color changing link will be described. The Zion ink is formed to have a light-shielding black color at normal temperature. The color of the ink is changed to become transparent when raised to a certain temperature by a heating device or when lowered to a certain temperature by a cooling device, so that an alignment process by align mark confirmation may be performed during the cell creation process. Respective layers that form a display device are permeable to light to a certain extent. Thus, if light is internally or externally generated when the display device is completely manufactured, light emitting or reflected from the inside of the display may be transmitted to the outside. In order to prevent this, the black color is set to be maintained at normal temperature. In the Zion ink, various opaque colors other than the black can also be used.

Likewise, when a photochromic ink is used as the color changing ink, light is irradiated by using a separate irradiation device only at the time of performing the alignment process so that the alignment process may be possible in the state where the color changing ink is set to become transparent.

Figure 6:
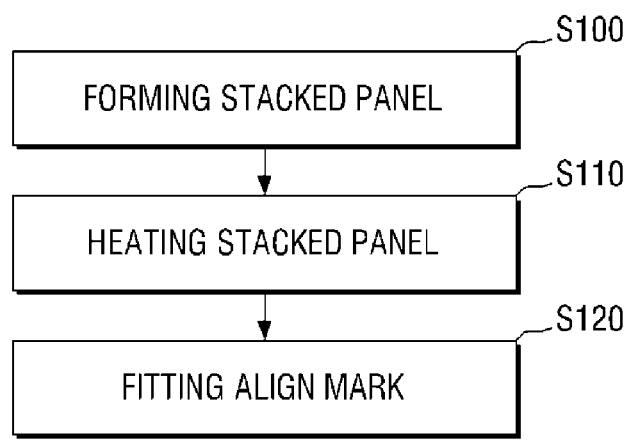
FIG. 6 is a flowchart illustrating a method of manufacturing a display device according to an exemplary embodiment of the present invention.
Figure 7:
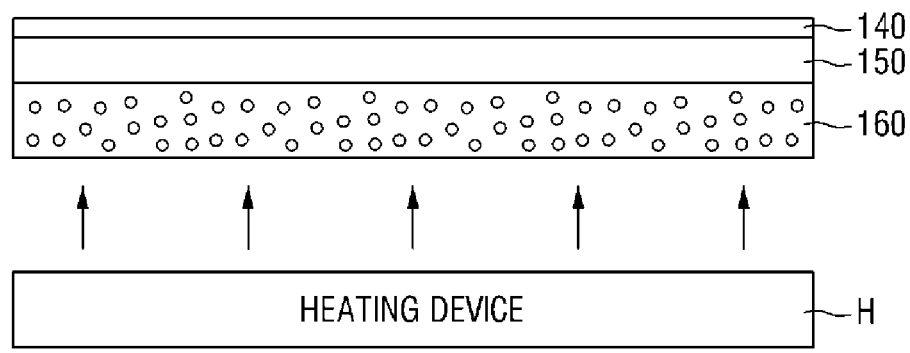
FIG. 7 schematically illustrates a heating process for a display device according to an exemplary embodiment of the present invention.

FIG. 6 is a flowchart illustrating a method of manufacturing a display device according to an exemplary embodiment of the present invention, and FIG. 7 schematically illustrates performing a heating process in a display device according to an exemplary embodiment of the present invention.

Generally, a display substrate, which is used in the manufacture of display devices such as a Thin Film Transistor-Liquid Crystal Display (TET-LCD), a Plasma Display Panel (PDP), and an Electro Luminescent (EL) display, is subjected to an alignment process before or during the production, transport, performance examination, etc. of the display device.

Referring to FIG. 6 along with FIGS. 1 to 5, a method of manufacturing a display device according to an exemplary embodiment of the present invention includes an operation (S100) of forming a stacked panel including a display panel 130, a first adhesive layer 140, a polymer layer 150, and a second adhesive layer, including a color changing ink in at least one layer of the stacked panel, an operation (S110) of heating the stacked panel, and an operation (S120) of fitting an align mark 5. Below, the redundant description of the above respective operations is omitted.

With respect to the operation (S110) of heating the stacked panel, and referring to FIG. 7, color changing ink from at least one of the stacked first adhesive layer 140, the polymer layer 150, and the second adhesive layer 160 is changed to be transparent by performing heating by using a heating device H. If the color changing ink is color-changed to become transparent when lowered from normal temperature to a low temperature, a cooling device (not shown) may be used instead of the heading device H.

Figure 8:
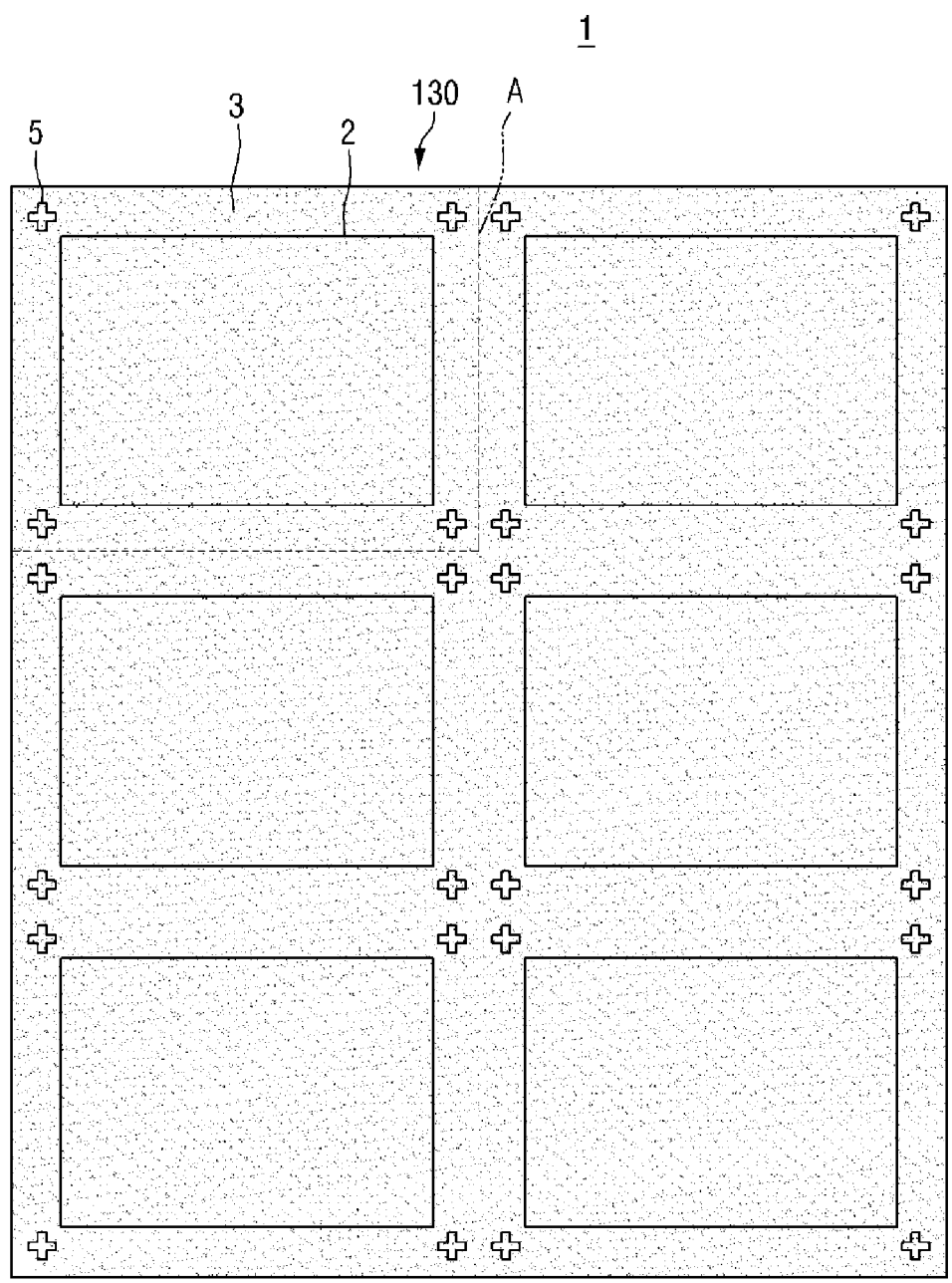
FIG. 8 is a plane view of a mother substrate according to an exemplary embodiment of the present invention.

FIG. 8 is a plane view of a mother substrate according to an exemplary embodiment of the present invention. Referring to FIG. 8 along with FIG. 6, a mother substrate 1 is prepared before performing the operation (S120) of fitting an align mark. Then, a cutting process in area A for partitioning a unit display panel among a plurality of display panels included in the mother substrate 1 may be performed. An align mark 5 is formed at one or more positions of the non-display area 3. The non-display area 3 is an area where in which a display is not generated where respective layers have been stacked, on the mother substrate 1. A color changing ink is contained in the entire area of the display area 2 and the non-display area 3. The color of the color changing ink is opaque at normal temperature, and thus, the alignment of the respective layers may be difficult. Hence, the color changing ink is made to be transparent by using, for example, the heating device H. Although it is illustrated that the align mark 5 has a cross shape, the align mark 5 may be formed in various shapes.

The color changing ink may be made opaque again by cooling the mother substrate 1. Such a cooling process may be performed using a separate cooling device for process efficiency, but it is also possible that the mother substrate 1 is cooled at normal temperature without a separate cooling device. Further, when the ink is color-changed when the temperature is lowered from normal temperature to a low temperature, the color may naturally become opaque by bringing ink back to normal temperature.

Figure 9:
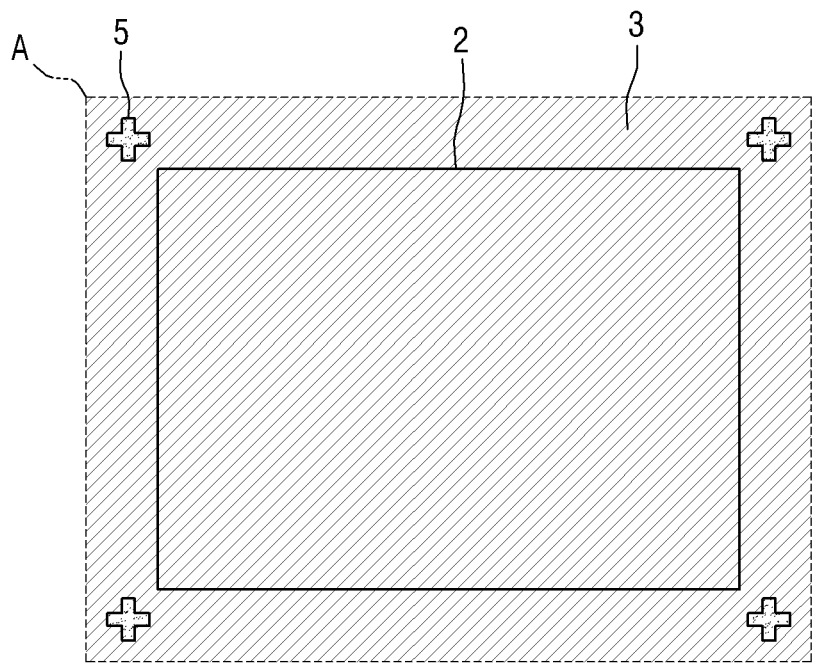
FIG. 9 is a plane view of a mother substrate according to a second embodiment of the present invention for area A of FIG. 8.
Figure 10:
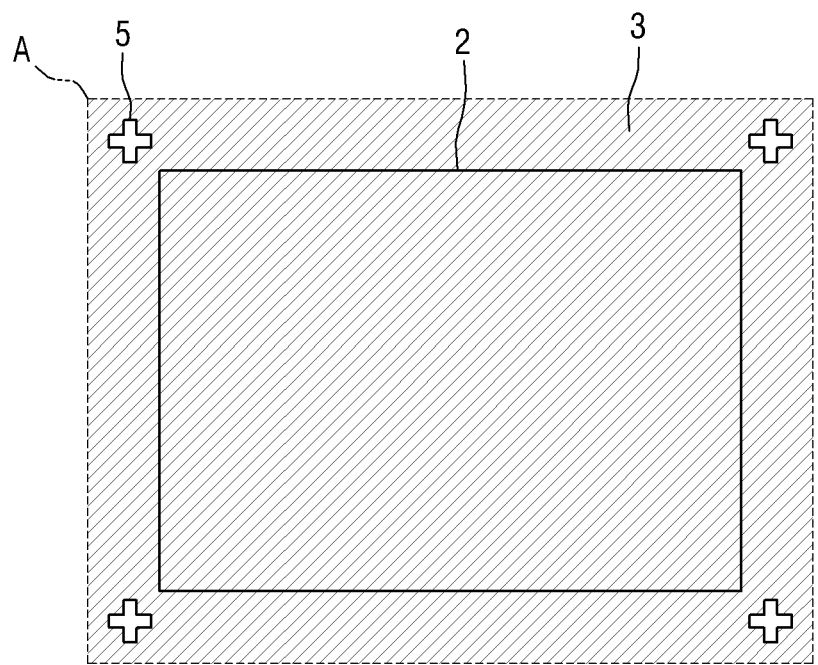
FIG. 10 is a plane view illustrating a state in which a heating process has been performed on a mother substrate according to a second embodiment of the present invention.

FIG. 9 is a plane view of a mother substrate according to a second exemplary embodiment of the present invention for area A of FIG. 8, and FIG. 10 is a plane view illustrating a state in which a heating process has been performed on a mother substrate according to a second exemplary embodiment of the present invention.

Referring to FIGS. 9 and 10 along with FIG. 6, in an area which overlaps the align mark 5, at least one of the first adhesive layer 140, the second adhesive layer 160, and the polymer layer 150, may contain a color changing ink. A common light-shielding ink may be included in the remaining area. That is, if an operation (S110) of heating the stacked panel is performed, as illustrated in FIG. 10, a color changing ink contained in the area corresponding to the align mark 5 becomes transparent, and confirmation of the align mark 5 becomes possible.

Figure 11:
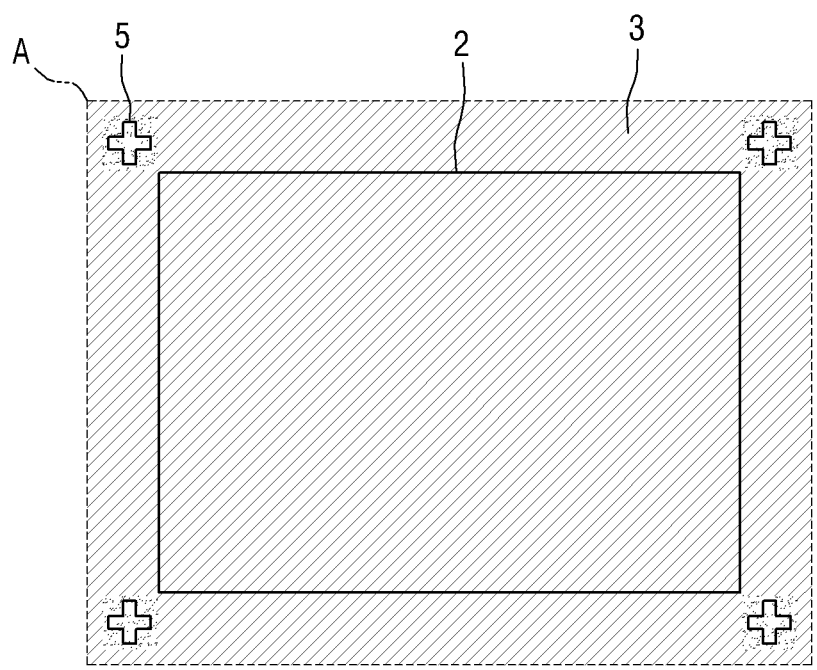
FIG. 11 is a plane view of a mother substrate according to a third embodiment of the present invention for area A of FIG. 8.
Figure 12:
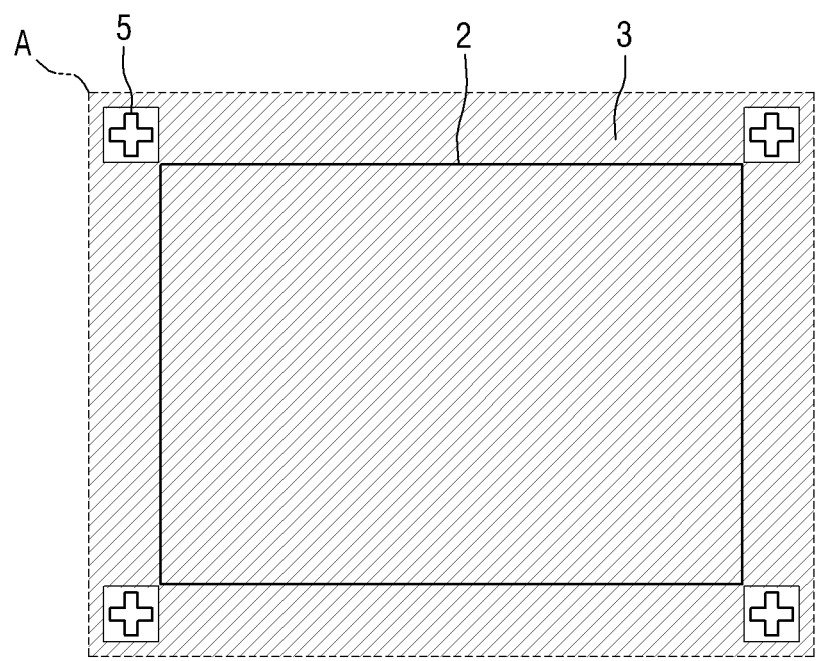
FIG. 12 is a plane view illustrating a state in which a heating process has been performed on a mother substrate according to a third embodiment of the present invention.

FIG. 11 is a plane view of a mother substrate according to a third exemplary embodiment of the present invention for area A of FIG. 8, and FIG. 12 is a plane view illustrating a state in which a heating process has been performed on a mother substrate according to a third embodiment of the present invention. Referring to FIGS. 11 and 12 along with FIG. 6, a color changing ink is contained in a quadrilateral shaped area around align mark 5, and a light-shielding ink is contained in the area outside the area where the color changing ink is included. That is, when the operation (S110) of heating the stacked panel is performed, as illustrated in FIG. 12, the color changing ink of a quadrilateral shape becomes transparent, and thus the align mark 5 may be displayed even when the first adhesive layer 140, the high polymer layer 150, and the second adhesive layer 160 have been stacked.

Figure 13:
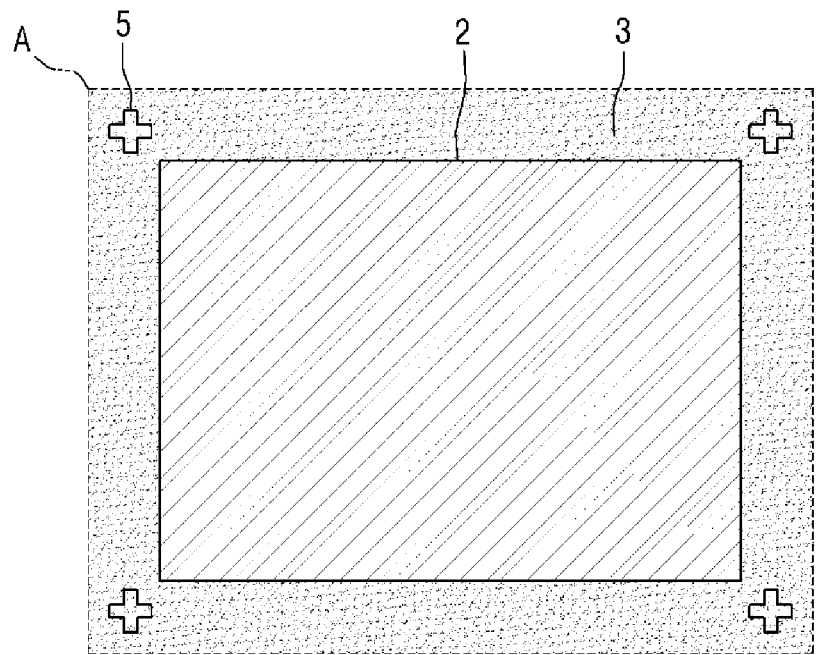
FIG. 13 is a plane view of a mother substrate according to a fourth embodiment of the present invention for area A of FIG. 8.
Figure 14:
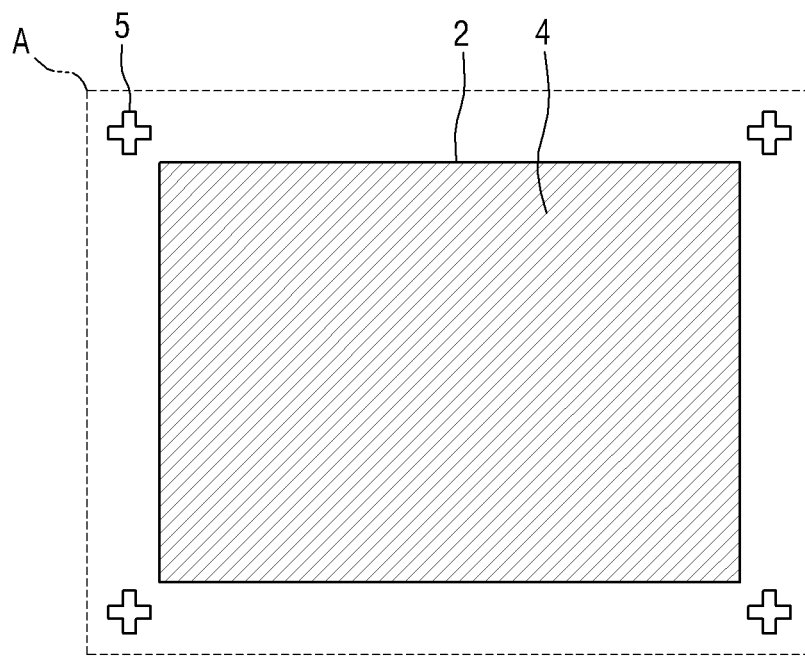
FIG. 14 is a plane view illustrating a state in which a heating process has been performed on a mother substrate according to a fourth embodiment of the present invention.

FIG. 13 is a plane view of a mother substrate according to a fourth exemplary embodiment of the present invention for area A of FIG. 8, and FIG. 14 is a plane view illustrating a state where a heating process has been performed on a mother substrate according to a fourth exemplary embodiment of the present invention. Referring to FIGS. 13 and 14 along with FIG. 6, a color changing ink is contained in an area along the non-display area 3 where an align mark 5 has been positioned. The area where the color changing ink is disposed may have a constant width. When the operation (S110) of heating a stacked panel is performed, as illustrated in FIG. 14, a non-display area 3 including a color changing ink included in the non-display area 3 becomes transparent.

Figure 15:
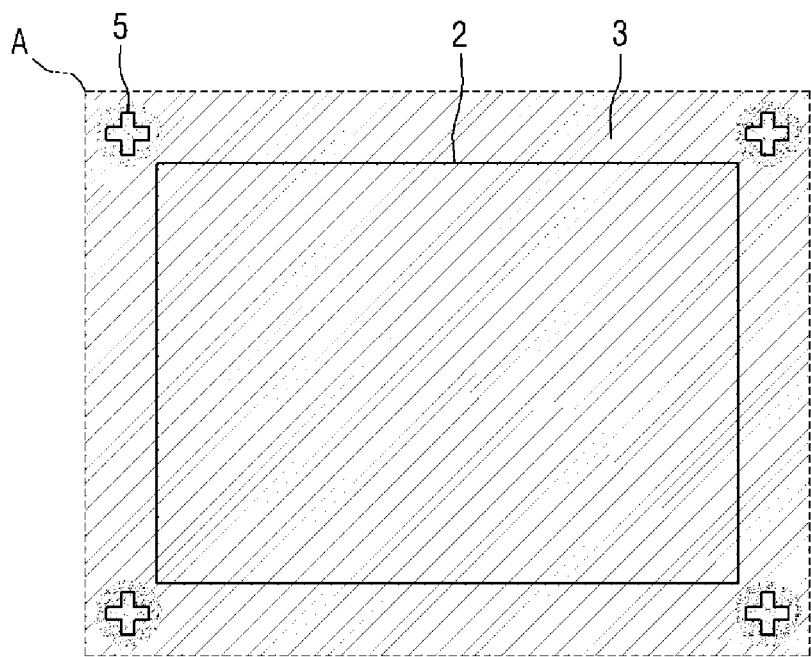
FIG. 15 is a plane view of a mother substrate according to a fifth embodiment of the present invention for area A of FIG. 8.
Figure 16:
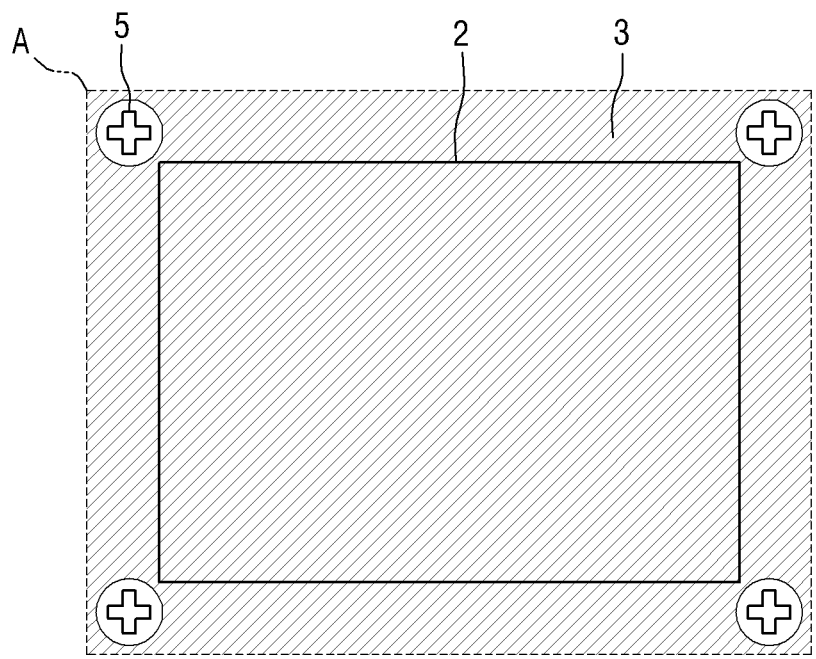
FIG. 16 is a plane view illustrating a state in which a heating process has been performed on a mother substrate according to a fifth embodiment of the present invention.

FIG. 15 is a plane view of a mother substrate according to a fifth exemplary embodiment of the present invention for area A of FIG. 8, and FIG. 16 is a plane view illustrating a state where a heating process has been performed on a mother substrate according to a fifth exemplary embodiment of the present invention. Referring to FIGS. 15 and 16 along with FIG. 6, a color changing ink is included in an ellipse-shaped area defined around align mark 5. When the operation (S110) of heating the stacked panel is performed, a color changing ink of the ellipse-shape becomes transparent, as illustrated in FIG. 16.

Figure 17:
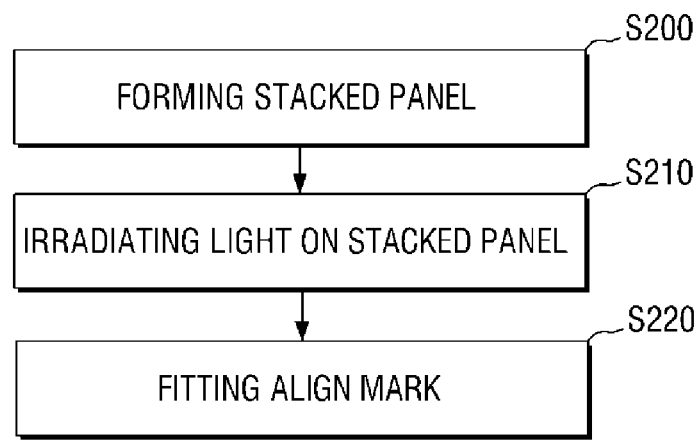
FIG. 17 is a flowchart illustrating a method of manufacturing a color changing ink which is applied to a display device according to a sixth embodiment of the present invention.
Figure 18:
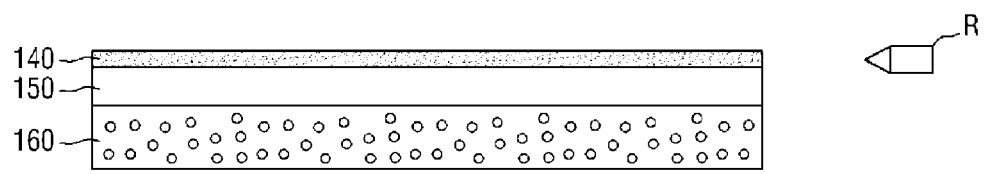
FIG. 18 is a cross-sectional view of a color changing ink which has been applied to a first adhesive layer of a display device according to a sixth embodiment of the present invention.
Figure 19:
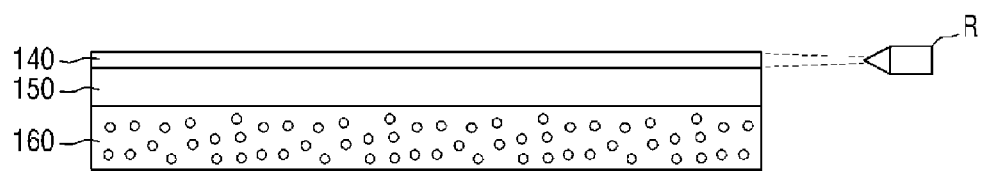
FIG. 19 is a cross-sectional view schematically illustrating a state in which a light irradiation process is performed in a first adhesive layer of FIG. 18.
Figure 20:
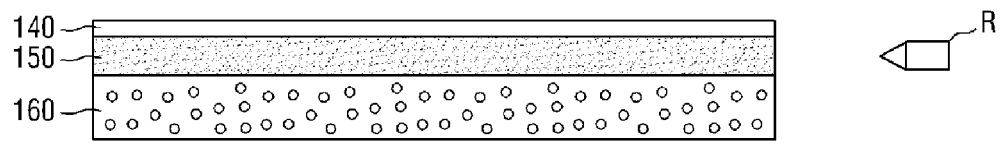
FIG. 20 is a cross-sectional view illustrating a color changing ink which has been applied to a polymer layer of a display device according to a seventh embodiment of the present invention.
Figure 21:
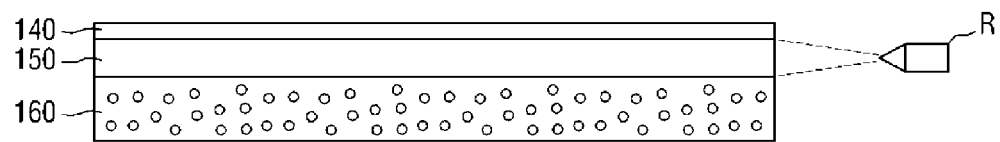
FIG. 21 is a cross-sectional view schematically illustrating a state in which a light irradiation process is performed in a polymer layer of FIG. 20.
Figure 22:
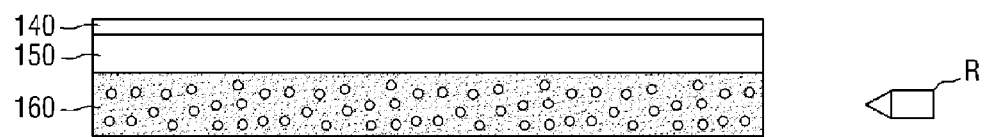
FIG. 22 is a cross-sectional view illustrating a color changing ink which has been applied to a second adhesive layer of a display device according to an eighth embodiment of the present invention.
Figure 23:
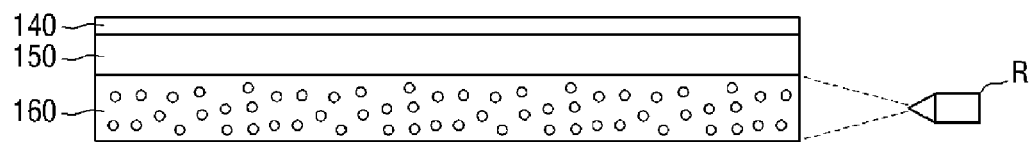
FIG. 23 is a cross-sectional view schematically illustrating a state in which a light irradiation process is performed in a second adhesive layer of FIG. 22.

FIG. 17 is a flowchart illustrating a method of manufacturing a color changing ink which is applied to a display device according to an exemplary embodiment of the present invention, FIG. 18 is a cross-sectional view of a color changing ink which has been applied to a first adhesive layer of a display device according to an exemplary embodiment of the present invention, FIG. 19 is a cross-sectional view schematically illustrating a state where a light irradiation process is performed in a first adhesive layer of FIG. 18, FIG. 20 is a cross-sectional view illustrating a color changing ink which has been applied to a polymer layer of a display device according to an exemplary embodiment of the present invention, FIG. 21 is a cross-sectional view schematically illustrating a state where a light irradiation process is performed in a polymer layer of FIG. 20, FIG. 22 is a cross-sectional view illustrating a color changing ink which has been applied to a second adhesive layer of a display device according to an exemplary embodiment of the present invention, and FIG. 23 is a cross-sectional view schematically illustrating a state where a light irradiation process is performed in a second adhesive layer of FIG. 22.

Referring to FIG. 17 along with FIGS. 18 to 23, a method of manufacturing a display device according to an exemplary embodiment of the present includes the operation (S220) of forming a stacked panel including a display panel, and a first adhesive layer 140, a polymer layer 150, and a second adhesive layer 160 including a color changing ink in at least one layer, the operation (S210) of radiating light on the stacked panel, and the operation (S220) of fitting an align mark 5.

According to exemplary embodiments of the present invention, a color ink is included in at least one of the first adhesive layer 140, the polymer layer 150, and the second adhesive layer 160 (FIGS. 18, 20 and 22). When light is radiated by a separate irradiation device, a photochromic ink, may become transparent. That is, when a photochromic ink is used as the color changing ink, the color changing ink is changed to become transparent by irradiating the photochromic ink in a certain wavelength by using a separate irradiation device R before the operation (S220) of fitting the align mark. Then, operation (S220) of fitting the align mark may be performed. Various opaque colors such as black may be displayed by the photochromic ink when light of a certain wavelength is not irradiated. Thus, photochromic ink, which is made transparent by light having a wavelength of ultraviolet or infrared area, not a visible ray area, may be used so as not to become transparent in a normal state, but exemplary embodiments of the present invention are not limited thereto.

Referring to FIG. 17 along with FIGS. 18 and 19, when a photochromic ink is included in the first adhesive layer 140, the irradiation device R is positioned at the side surface of the first adhesive layer 140, and when the operation (S210) of irradiating the stacked panel is performed, an align process of the operation (S220) of fitting the align mark because the photochromic ink of the first adhesive layer 140 becomes transparent becomes possible, as illustrated in FIG. 19.

Referring to FIG. 17 along with FIGS. 20 and 21, when the photochromic ink is included in the polymer layer 150, the irradiation device R is positioned at the side surface of the polymer layer 150, and when the operation (S210) of irradiating light on the stacked panel 150 is performed, as illustrated in FIG. 21, the photochromic ink of the polymer layer 150 becomes transparent so that the align process of the operation (S220) of fitting the align mark becomes possible.

Referring to FIG. 17 along with FIGS. 22 and 23, in which the photochromic ink is included in the second adhesive layer 160, the operation (S210) of irradiating light on the stacked panel from the side surface of the second adhesive layer 160 is performed using the irradiation device R. As illustrated in FIG. 23, the photochromic ink of the second adhesive layer 160 becomes transparent so that the align process of the operation (S220) of fitting the align mark becomes possible.

Although it is illustrated in FIGS. 18 to 23 that the irradiation device R is positioned at the side surface of the first adhesive layer 140, the polymer layer 150, and the second adhesive layer 160, but the irradiation device R may be positioned on the upper or lower surface of each of the layers for irradiation.

As described above, a display device according to exemplary embodiments of the present invention may be light-shielding while minimizing the thickness of the device.

Although certain exemplary embodiments and implementations have been described herein, other embodiments and modifications will be apparent from this description.

Accordingly, the inventive concept is not limited to such embodiments, but rather to the broader scope of the presented claims and various obvious modifications and equivalent arrangements.

What is claimed is:

1. A display device, comprising:
a display panel comprising a pixel area arranged in a matrix, the display panel comprising an upper substrate and a lower substrate facing each other;
a cover window disposed on a first side of the display panel;
a first adhesive layer directly disposed on a second side which is opposite to the first side of the display panel;
a polymer layer directly disposed on the first adhesive layer;
a second adhesive layer directly disposed on the polymer layer; and
a heat sink layer directly disposed on the second adhesive layer,
wherein the at least one of the first adhesive layer and the second adhesive layer comprises a color changing ink.

2. The display device of claim 1, wherein the first adhesive layer comprises an acrylic compound.

3. The display device of claim 1, wherein the second adhesive layer comprises at least one of a urethane compound, a silicon compound, and an acrylic compound.

4. The display device of claim 1, wherein the second adhesive layer comprises a foam structure.

5. The display device of claim 1, wherein a thickness of the first adhesive layer is between 0.1 μm and 8 μm.

6. The display device of claim 1, wherein a thickness of the second adhesive layer is between 10 μm and 80 μm.

7. The display device of claim 1, wherein the polymer layer comprises at least one of polyethylene terephthalate (PET), polyethylene naphthalate (PEN), polyethersulfone (PES), and polyethylene (PE).

8. The display device of claim 1, wherein the heat sink layer comprises at least one of graphite, aluminum (Al), and copper (Cu).

9. The display device of claim 1, wherein the color changing ink comprises at least one of thermochromic ink and photochromic ink.

10. The display device of claim 1, wherein at least one of the first adhesive layer, the polymer layer, and the second adhesive layer comprises a light-shielding ink.

* * * * *